United States Patent [19]
Wright et al.

[11] Patent Number: 5,584,183
[45] Date of Patent: Dec. 17, 1996

[54] THERMOELECTRIC HEAT EXCHANGER

[75] Inventors: Lloyd F. Wright, Pleasant Valley, N.Y.; Clifford C. Wright, Rancho Palos Verdes, Calif.

[73] Assignee: Solid State Cooling Systems, LaGrangeville, N.Y.

[21] Appl. No.: 484,040

[22] Filed: Jun. 7, 1995

Related U.S. Application Data

[63] Continuation of Ser. No. 198,418, Feb. 18, 1994, abandoned.

[51] Int. Cl.$^6$ .............................. F25B 21/02; F25B 29/00
[52] U.S. Cl. .................................................. 62/3.7; 165/58
[58] Field of Search .......................... 62/3.2, 3.7; 165/58, 165/76

[56] References Cited

U.S. PATENT DOCUMENTS

| | | | |
|---|---|---|---|
| 2,938,357 | 5/1960 | Sheckler | 62/3.2 |
| 3,095,709 | 7/1963 | Demand | 62/3.2 |
| 3,137,142 | 6/1964 | Venema | 62/3.2 |
| 3,178,895 | 4/1965 | Mole et al. | 62/3.2 |
| 3,196,620 | 7/1965 | Elfving et al. | 62/3.2 |
| 3,197,342 | 7/1965 | Neild | 62/3.2 |
| 3,399,536 | 9/1968 | Walz | 62/3.2 |
| 4,065,936 | 1/1978 | Fenton et al. | 62/3.3 |
| 4,306,426 | 12/1981 | Berthet et al. | 62/3.3 |
| 4,622,822 | 11/1986 | Beitner | 62/3.2 |
| 5,038,569 | 8/1991 | Shirota et al. | 62/3.2 |
| 5,042,257 | 8/1991 | Kendrick et al. | 62/3.1 |
| 5,279,128 | 1/1994 | Tomatsu et al. | 62/3.4 |

*Primary Examiner*—William Doerrler
*Attorney, Agent, or Firm*—Townsend and Townsend and Crew

[57] ABSTRACT

An improved thermoelectric heat exchanger is provided which comprises a series of thermoelectric units sandwiched between two channels for the purpose of transferring heat from a liquid coolant flowing through one channel to a second fluid flowing through the other channel. Heat transfer fins are brazed to the inner surfaces of both channels to provide improved heat transfer between the fluids and the channels. A thermally conductive grease or ductile metal between the thermoelectric units and the channels provides improved heat transfer at this interface. When an electric current is passed through the thermoelectric units, heat is transferred from the liquid coolant through the thermoelectric units to the second fluid via the Peltier Effect.

4 Claims, 3 Drawing Sheets

5,584,183

THERMOELECTRIC HEAT EXCHANGER

This is a Continuation of application Ser. No. 08/198,418, filed Feb. 18, 1994, now abandoned.

BACKGROUND OF THE INVENTION

The present invention relates to thermoelectric heat exchangers; particularly, to an improved thermoelectric heat exchanger for transferring heat between two fluids.

Many types of industrial equipment require liquid cooling or heating during their operation. Typical examples include semiconductor process equipment, pharmaceutical and biotechnology fermentation/separation vats, machine tools, air conditioners, plastic molding/extrusion equipment, analytical equipment, welding equipment, and lasers. One common way to provide the required cooling or heating is with a recirculating coolant temperature control unit, or chiller. A typical chiller consists of a freon-based refrigeration loop connected to a recirculating coolant loop via a heat exchanger. However, as the world community becomes increasingly concerned about ozone depletion and global warming, a replacement for the standard freon-based refrigeration technology is urgently needed. Thermoelectric technology offers a clean, environmentally-friendly, solid state alternative.

Thermoelectric cooling was first discovered by Jean-Charles-Athanase Peltier in 1834, when he observed that a current flowing through a junction between two dissimilar conductors induced heating or cooling at the junction, depending on the direction of current flow. Practical use of thermoelectrics did not occur until the early 1960s with the development of semiconductor thermocouple materials which were found to produce the strongest thermoelectric effect. Most thermoelectric materials today comprise a crystalline quaternary alloy of bismuth, tellurium, selenium, and antimony.

Thermoelectric modules are manufactured by electrically connecting in series a large number of bismuth-telluride P-type (25% $Bi_2Te_3$+72% $Sb_2Te_3$+3% $Sb_2Se_3$) and N-type (90% $Bi_2Te_3$+5% $Sb_2Te_3$+5% $Sb_2Se_3$) crystal pairs. When direct current is passed through the module, heating or cooling at the junction of the dissimilar materials occurs depending on the direction of current flow. The junctions are physically arranged so that each cold junction in the series is in thermal contact with the body to be cooled and each hot junction is in contact with the body to be heated. Such an arrangement allows for the transfer of heat between the two bodies.

Although thermoelectric technology has been available since the early 1960s, most applications have employed the technology for cooling electronic devices or air. For liquids, the few current applications employ relatively inefficient means to transfer heat to, or from, the liquid coolant to another fluid. For example, current thermoelectric devices which inject their heat into ambient temperature (21° C.) fluids can only cool liquids to near the freezing point of water.

A more effective thermoelectric heat exchanger is therefore desirable to transfer heat between two fluids. The improved heat exchanger should cool a liquid 40° C. below the temperature of the second fluid without requiring the stacking of multiple thermoelectric modules within the heat exchanger, often referred to as cascading. The present invention uses compact heat transfer surfaces to minimize the resistance to heat transfer and thus allows for more efficient cooling to levels not before attained.

SUMMARY OF THE INVENTION

The present invention provides for an improved thermoelectric heat exchanger comprised of a series of thermoelectric units sandwiched between two fluid-bearing channels. The thermoelectric units transfer heat from a first fluid flowing through one of the channels to a second fluid flowing through the other channel. Heat transfer between the fluids is improved by increasing the heat transfer area with heat transfer fins inside each of the channels. The thermal connection between the thermoelectric units and the two channels is also improved. Clamping the two channels and the thermoelectric units together with a compressive load improves the thermal contact between the thermoelectric units and the channels. Further, insulation or foam placed between the thermoelectric units minimizes conductive heat losses in the direction opposite to the desired heat flow and acts as a moisture barrier preventing condensation on the thermoelectric modules which would cause an electrical short.

A further understanding of the nature and advantages of the invention will become apparent by reference to the remaining portions of the specification and drawings.

DETAILED DESCRIPTION OF SPECIFIC EMBODIMENTS

Figure 1:
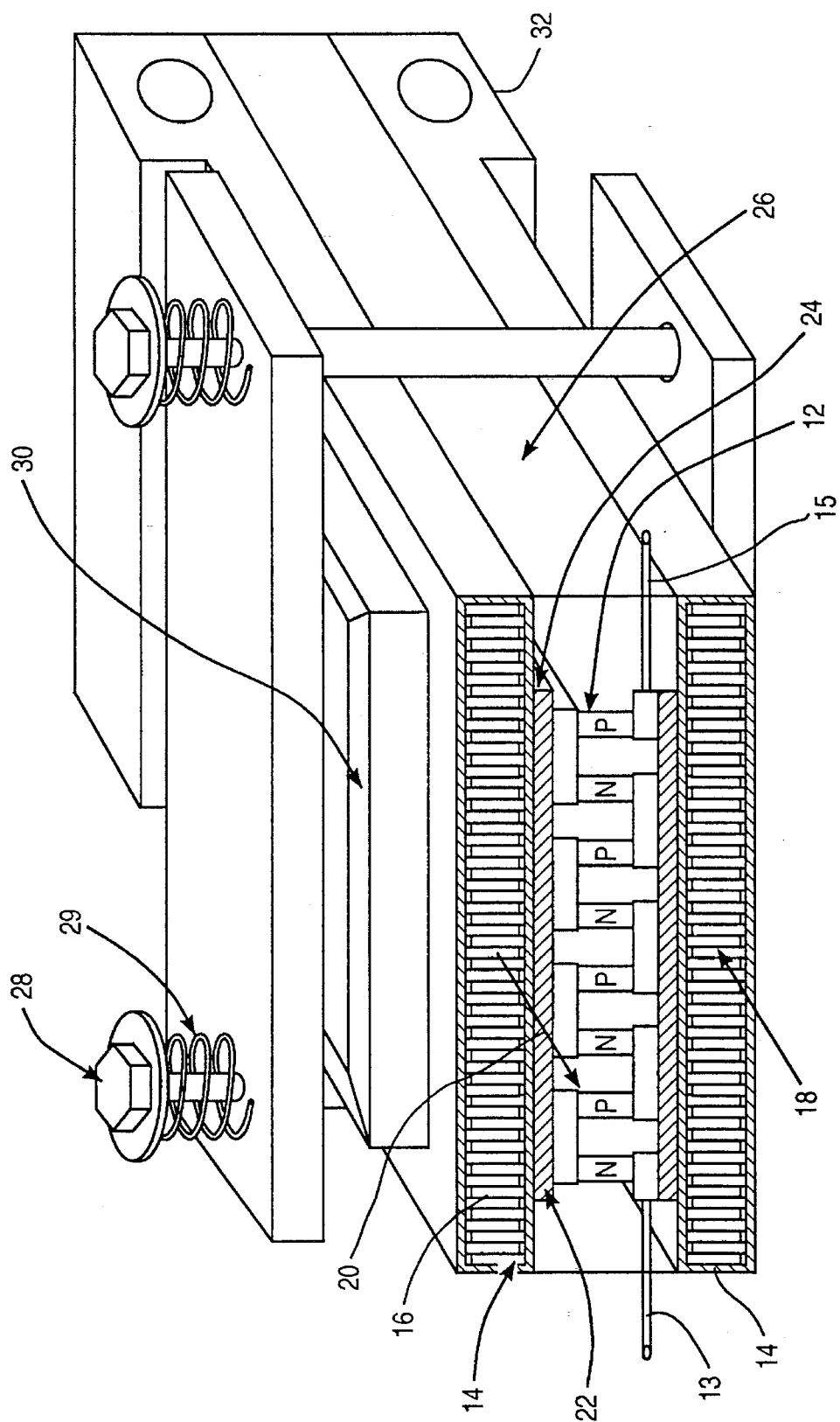
FIG. 1 is a detailed cross-sectional view of an improved thermoelectric heat exchanger according to the present invention.

In FIG. 1, an improved thermoelectric heat exchanger 10 is shown. The heat exchanger 10 has a series of thermoelectric units 12 that are sandwiched between two channels 14. The units 12 transfer heat from a liquid coolant flowing through one channel, to a second fluid flowing through the other channel. The thermoelectric units 12 are formed from alternating P-type and N-type semiconductor material, connected in series electrically. As is known in the art, N-type thermal elements transfer heat in the reverse direction to the current, and P-type thermal elements transfer heat in the direction of the current. By alternating P-type and N-type thermal elements, hot and cold junctions are formed when electric current is provided to the thermoelectric units 12 through leads 13 and 15. The heat exchanger 10 is thus configured so that heat may either be removed from, or added to, the liquid coolant by merely changing the direction of current flowing through the thermoelectric units 12.

In a preferred embodiment, the two channels 14 have an orthogonal cross-section, preferably rectangular. Within each of the two channels 14 are heat transfer fins 16. The rectangular channels 14 and heat transfer fins 16 are constructed of a thermally conductive metal, preferably aluminum. Other suitable metals include copper, iron, nickel, and their alloys. These metals can also be used alone or in various combinations for the thermally conductive metal. The heat transfer fins 16 greatly increase the surface area for heat transfer between a channel 14 and the liquid flowing through it. The heat transfer fins 16 are fashioned to contact the inner surfaces of the channels 14. At the points of contact, the heat transfer fins 16 are brazed to the inner surfaces of the channels 14. The brazed contacts between the fin 16 and the channels 14 provide improved thermal contact to transfer heat from the fins 16 to the channels 14. Since both the fins 16 and the channels 14 are subjected to a range of temperatures, the fins 16 are preferably constructed from a material with thermal expansion that is nearly the same as the channel 14. Preferably, the fins 16 and the channels 14 are constructed of the same material. Similarly, the brazing material should also have a similar thermal expansion rate as the fins 16 and the channels 14. The fins 16 are brazed to the channel 14 either by vacuum brazing or dip brazing.

The fin design depends upon several factors: the heat transfer efficiency required, heat exchanger compactness, allowable pressure drop in the fluids flowing through the heat exchanger, and manufacturability (cost) considerations.

Figure 3:
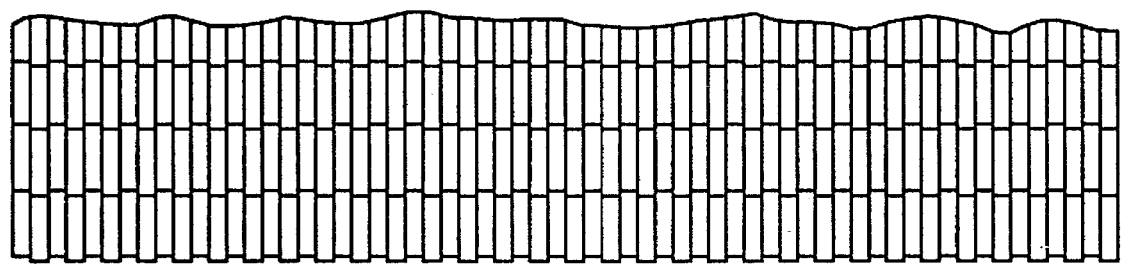
FIG. 3 illustrates offset fins which may be used in the heat exchanger of FIG. 1.

The total surface area of fins in the heat exchanger is dependent upon the heat transfer efficiency required, the type of fins used, the fluid flow rates and fluid properties. Offset fins, as shown in FIG. 3, disrupt the development of laminar flow, maintaining turbulent flow which yields increased heat transfer. This yields a more compact heat exchanger.

The fin density is dependent on the heat exchanger compactness desired. For offset fins, the ratio of surface area to volume ranges from 100–1000 sq. ft. per cubic ft. volume. Heat exchangers employing fins toward the low end of fin density tend to be large. Heat exchangers toward the high end of fin density become increasingly more difficult to manufacture. A good compromise between compactness and ease of manufacture is near 500 sq. ft. per cubic ft.

The thickness of the fins is also dependent upon heat exchanger performance required. Thicker fins transfer heat more readily, but are more difficult to manufacture. Typical thicknesses for offset fins range from 0.004 to 0.01 inch. The current design uses 0.008 inch.

The spacing of fins (or pitch) and the distance before the fins offset are determined again by the heat exchanger performance, compactness, allowable pressure drop, and manufacturability considerations. In the current design we employ 16 fins per inch with a ⅛" distance before offset.

The fins 16 may be oriented in a channel 14 in either a straight or in an offset manner with respect to the flow of the liquid. Preferably, the fins 16 have square-wave like geometry in a cross-sectional view perpendicular to the liquid flow in the channels 14 as shown in FIG. 1. With the square, wave-like geometry, the fins 16 contact the channels 14 along each of the square waves. At these points, the fins 16 may be brazed to channels 14 in the manner previously discussed.

Offset fins have an advantage in thermoelectric heat exchangers. Their increased compressive strength helps support the fluid channel from the compressive load applied by the clamps to improve thermal contact efficiency between the thermoelectrics and the channels. Situations where high pressure drop is not desirable, such as with air or other gas as one fluid, straight fins should be employed instead of offset fins. Here dimples, or longitudinal waves can be added to the fins to increase heat transfer efficiency and improve overall heat exchanger compactness.

The dimensions of the overall liquid channel with fins depends upon space considerations along with heat exchanger performance. In the design of the heat exchanger shown in FIG. 1, two thermoelectric modules, standard CP5-3106L modules from Melcor of Trenton, N.J. are located side by side. This sets the heat exchanger width at approximately five inches. The length of the heat exchanger and the total number of thermoelectric modules employed is determined by the cooling capacity required. The height of the channel is dependent upon allowable pressure drop and desired compactness. Greater channel height yields lower pressure drop, but makes the heat exchanger less compact. Too low a channel height causes manufacturability problems. A height of 0.125–0.5 inches provides best results, where a height of 0.25 inches appears as a good compromise. Once the width and height of the heat exchanger have been chosen, the length is determined by the overall heat exchanger capacity required.

Preferable liquids for the channels 14 include a mixture of ethylene glycol and water, Syltherm XLT (Dow-Corning) or other low temperature heat transfer fluid. Preferably, the coolant liquid from which heat is removed is a mixture of ethylene glycol and water, and the fluid receiving the heat is water. To achieve improved efficiency and improved cooling, the fluids flowing through each channel flow in opposite directions, or counterflow, as shown by arrows 18 and 20. Alternatively, an orthogonal flow, or crossflow configuration, can be employed with only a slight reduction in efficiency.

Figure 2:
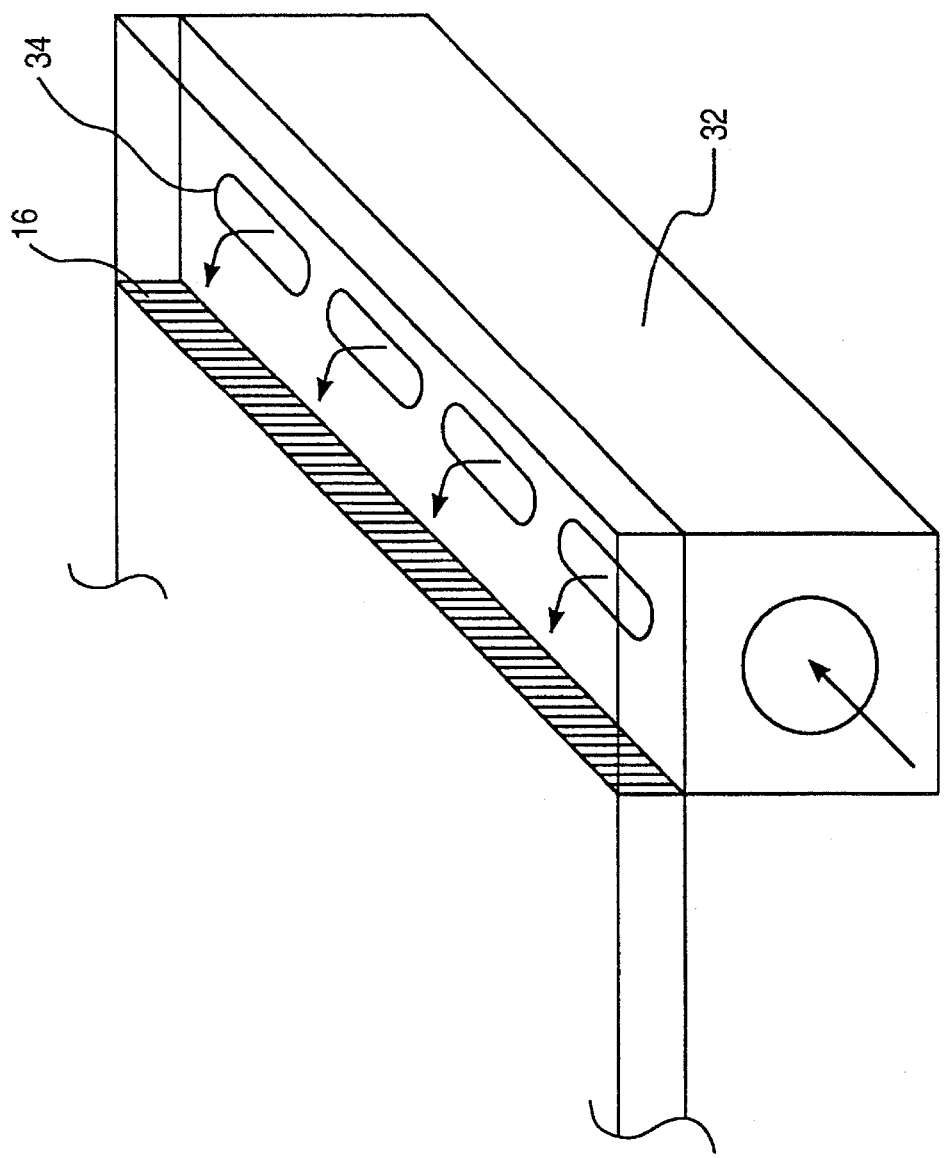
FIG. 2 is a detail of the manifold of heat exchanger shown in FIG. 1.

Even distribution of the fluids flowing through the channels 14 is accomplished through the use of fluid distribution manifolds 32 shown in cross-sectional view in FIG. 2. The fluid distribution manifold design evenly distributes the fluids entering the heat exchanger without causing a large pressure drop. For good fluid distribution, the inlet velocity head $P^{V2}/2pg$—fluid velocity squared/(two times the fluid density times the gravitational constant)) should be less than or equal to 10% of the pressure drop across the heat exchanger.

Between the thermoelectric elements 12 and the channels 14 is a thermoelectric ceramic insulator 22. The ceramic insulator 22 electrically insulates the thermoelectric units 12 from the remainder of the heat exchanger 10. Between the ceramic insulator 22 and the channels 14 is a very thin layer of thermal contact material 24 (0.001 to 0.002 inch thick), which greatly improves the heat transfer at the interface between the channels 14 and the thermoelectric units 12. Suitable materials include a thermally conductive grease, such as Dow Chemical type 340 from Dow Chemical Corporation of Midland, Mich., or Wakefield Engineering type 120 from Wakefield Engineering Corporation of Wakefield, Mass.; a ductile metal tape, such as aluminum; a thin film of ductile metal, such as indium; or a low temperature solder, such as Bismuth-Tin solder, which greatly reduce the thermal contact resistance at the interface. The thermally conductive material 24 at this interface also allows for a different thermal expansion between the metal channels 14 and the ceramic insulator 22 without causing large stresses to occur.

The interface between the channels 14 and the ceramic insulator 22 should be very flat to ensure good thermal contact. The rectangular channels 14 should be flat to within 0.001 inch per inch length, with a total flatness deviation not exceeding 0.005 inch. The surface of the thermoelectric units 12 must also be flat to within 0.001 inch per inch length.

Furthermore, an insulating material 26, such as an insulating foam, fills the gaps between the thermoelectric units 12 to minimize conductive heat losses in the direction opposite to the desired heat flow. A preferable insulating foam is a foamed polyurethane. A foam insulation allows the insulation to be injected between the thermoelectric units 12 in a preassembled heat exchanger 10. This foam also serves as a moisture barrier, preventing condensation on the thermoelectric modules. Alternatively, the foam insulation can be precut and used as a template for properly aligning the thermoelectric units 12 between the channels 14.

The heat exchanger 10 is clamped together to provide a compression load thereby improving thermal contact between the thermoelectric units 12 and the channels 14. Bolts, clamps or springs compressing a rubber load distribution pad may be used. A preferable device for clamping the heat exchanger 10 together are bolts 28 used in connection with springs 29 and a load distribution pad 30. However, any device suitable for evenly applying a compressive load from 100 to 300 psi to improve the thermal contact between the thermoelectric units 12 and the rectangular channels 14 can be used. In the described heat exchanger a compressive load of approximately 150 psi on the thermoelectric insulator 22 is preferable.

With the design as discussed above, the improved thermoelectric heat exchanger 10 yields a greatly improved heat transfer over previous designs. Typically, when the heat exchanger 10 is operating under a steady load within the operating range of the thermoelectric units 12, the temperature difference between the liquid coolant and the heat transferring surfaces within the channels 14 is less than 3° C. This yields a practical operating temperature of the liquid coolant approximately 40° C. below the temperature of the fluid into which heat is rejected. This temperature may be obtained without resorting to cascading as is presently required with prior art heat exchangers. As previously stated, with a reversal in current through the thermoelectric units 12, the temperature of the liquid coolant, now a heating fluid, can be raised 40° C. above the ambient.

Although the foregoing invention has been described in some detail by way of illustration and example, for purposes of clarity of understanding, it will be obvious that certain changes and modifications may be practiced within the scope of the appended claims.

What is claimed is:

1. An improved thermoelectric heat exchanger of the type comprising at least one thermoelectric unit sandwiched between two channels for the purpose of transferring heat between a first fluid flowing through one of the channels and a second fluid flowing through the other channel, the at least one thermoelectric unit having a plurality of thermoelectric elements between thermoelectric insulators forming sides of the thermoelectric unit, wherein the improvement comprises:

heat transfer fins inside each of the two channels, the two channels orthogonal in cross section, a surface of a side of each channel interfacing the thermoelectric units being flat with a flatness deviation not exceeding 0.001 inch per inch length;

thermal contact material between the sides of the thermoelectric unit and the two channels for providing effective thermal contact between the thermoelectric unit and the two channels;

means for clamping together and evenly distributing a compressive load between the two channels and the thermoelectric unit; and insulation between the thermoelectric units;

whereby heat is transferred more effectively between the first fluid flowing through one of the channels and the second fluid flowing through the other channel.

2. An improved thermoelectric heat exchanger of the type comprising at least one thermoelectric unit sandwiched between two channels for the purpose of transferring heat between a first fluid flowing through one of the channels and a second fluid flowing through the other channel, the at least one thermoelectric unit having a plurality of thermoelectric elements between thermoelectric insulators forming sides of the thermoelectric unit, wherein the improvement comprises:

heat transfer fins inside each of the two channels, a surface of a side of each channel interfacing the thermoelectric units being flat with a flatness deviation not exceeding 0.001 inch per inch length;

thermal contact material between the sides of the thermoelectric unit and the two channels for providing effective thermal contact between the thermoelectric unit and the two channels;

means for clamping together and evenly distributing a compressive load between the two channels and the thermoelectric unit; and insulation between the thermoelectric units;

whereby heat is transferred more effectively between the first fluid flowing through one of the channels and the second fluid flowing through the other channel.

3. An improved thermoelectric heat exchanger of the type comprising at least one thermoelectric unit sandwiched between two channels for the purpose of transferring heat between a first fluid flowing through one of the channels and a second fluid flowing through the other channel, the at least one thermoelectric unit having a plurality of thermoelectric elements between thermoelectric insulators forming sides of the thermoelectric unit, wherein the improvement comprises:

heat transfer fins inside each of the two channels, the two channels orthogonal in cross section;

thermal contact material between the sides of the thermoelectric unit and the two channels for providing effective thermal contact between the thermoelectric unit and the two channels;

means for clamping together and evenly distributing a compressive load between the two channels and the thermoelectric unit, the clamping together and evenly distributing means comprising compression bolts, springs, and a compression load distribution pad, the compression bolts and compression load distribution pad applying a compressive load from 25 psi to 300 psi; and insulation between the thermoelectric units;

whereby heat is transferred more effectively between the first fluid flowing through one of the channels and the second fluid flowing through the other channel.

4. The improved thermoelectric heat exchanger as in claim 1, wherein the total flatness deviation of said surface does not exceed 0.005 inch.

* * * * *